United States Patent [19]
Garbuzov et al.

[11] Patent Number: 6,133,520
[45] Date of Patent: Oct. 17, 2000

[54] HETEROJUNCTION THERMOPHOTOVOLTAIC CELL

[75] Inventors: Dmitri Zalmanovich Garbuzov; Victor Borisovich Khalfin, both of Princeton; Ramon Ubaldo Martinelli, Hightstown; Hao Lee, Lawrenceville; Nancy Ann Morris, Millstone Township; John Charles Connolly, Clarksburg, all of N.J.

[73] Assignee: Sarnoff Corporation, Princeton, N.J.

[21] Appl. No.: 09/190,674

[22] Filed: Nov. 12, 1998

Related U.S. Application Data

[60] Provisional application No. 60/094,349, Jul. 28, 1998.

[51] Int. Cl.[7] .................................................. H01L 31/109
[52] U.S. Cl. ............................................................. 136/253
[58] Field of Search ...................................... 136/253, 262

[56] References Cited

U.S. PATENT DOCUMENTS

| | | | |
|---|---|---|---|
| 5,322,573 | 6/1994 | Jain et al. ............................... | 136/252 |
| 5,342,451 | 8/1994 | Virshup .................................... | 136/244 |
| 5,769,964 | 6/1998 | Charache et al. ....................... | 136/262 |
| 5,800,630 | 9/1998 | Vilela et al. ............................. | 136/249 |

*Primary Examiner*—Bernard Codd
*Attorney, Agent, or Firm*—William J. Burke

[57] ABSTRACT

A thermophotovoltaic cell and diode photodetector having improved open circuit voltage and high internal efficiency includes a semiconductor body having regions of n-type conductivity and p-type conductivity adjacent each other to form a p-n junction therebetween. The p-type region is of a material having a band gap which will absorb black-body radiation and the n-type region is of a material having a wider band gap than that of the p-type region. This forms a heterojunction between the two regions. The region of n-type region has a doping level which is an order of magnitude less than the doping level in the p-type region. This structure forms a cell having a space charge region in the n-type region.

16 Claims, 3 Drawing Sheets

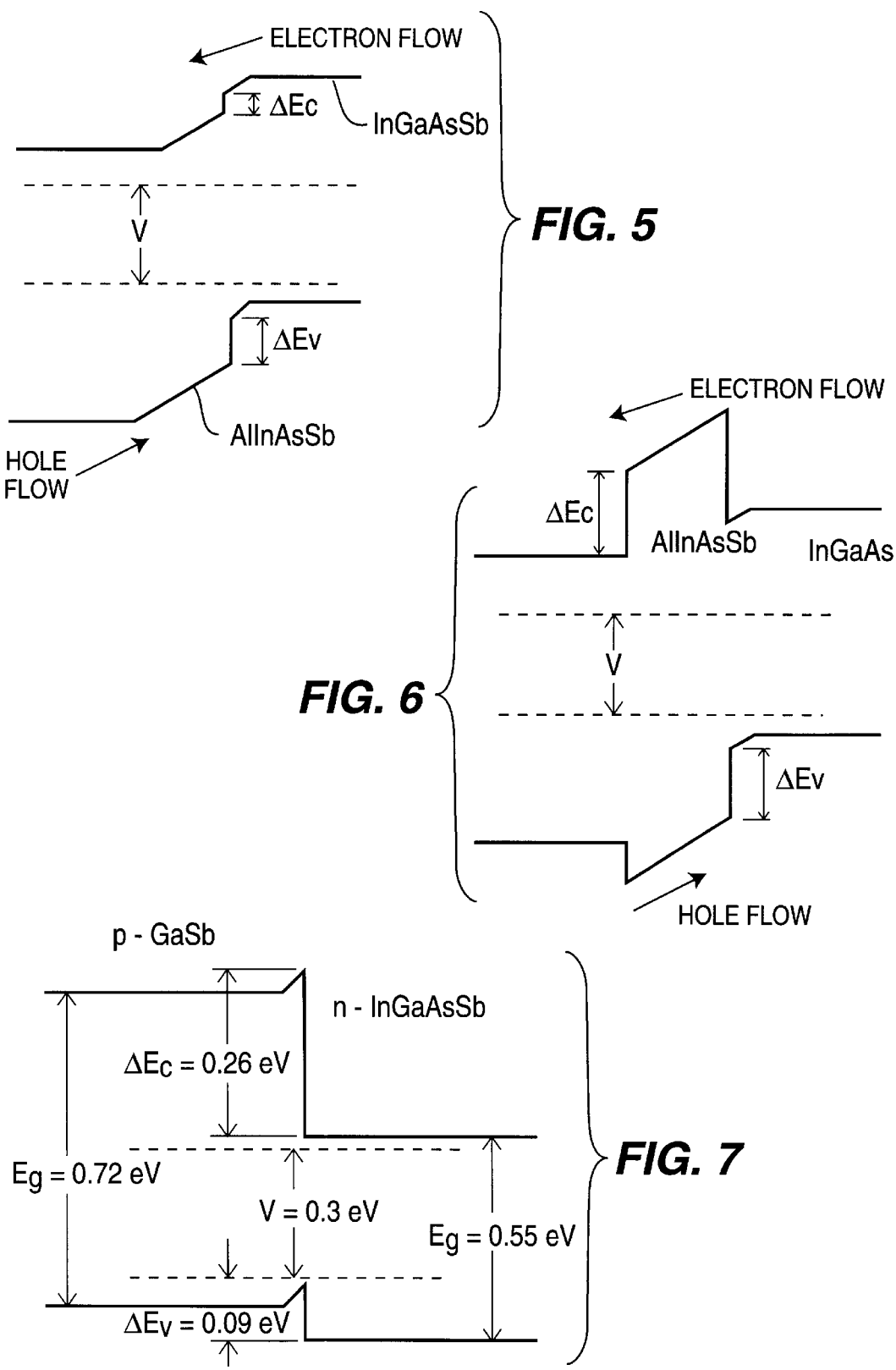

HETEROJUNCTION THERMOPHOTOVOLTAIC CELL

This application claims the benefit of U.S. provisional application Ser. No. 60/094,349 filed Jul. 28, 1998.

This invention was made with U.S. government support under contract numbers DEAC12-76SN00052 and KAPL PO PL00285277. The U.S. government has certain rights in this invention.

FIELD OF THE INVENTION

The present invention relates to infrared photodiode cells, and, more particularly to thermophotovoltaic (TPV) cells having a heterojunction for decreased dark current and increased photovoltage at a given illumination.

BACKGROUND

Photovoltaics is the technology that typically transforms radiation, generally illumination, into electricity. Thermophotovoltaics is the technology of transforming infrared radiation, such as radiant heat generated by a source of energy, into electricity. Thermophotovoltaics offers a major advantage in certain settings as it can be operated at night or when the sky is overcast, thereby eliminating the need for batteries to store electricity. A semiconductor type thermovoltaic device can be designed to minimize pollutants, and, since it has no moving parts, will operate silently and reliably, requiring little maintenance.

TPV semiconductor devices have been heretofore made comprising a body of a suitable semiconductor material having a region of p-type conductivity adjacent a region of n-type conductivity forming a p-n junction therebetween. Since the material on both sides of the p-n junction has been the same, the p-n junction is a homojunction. To achieve direct conversion of black body (thermal) radiation to electrical energy, materials having a narrow band gap ($E_g$) have been used to provide efficient absorption of the black body infrared radiation. For example, given a black body at a temperature of 1000° C., materials with $E_g$ no greater than about 0.55 eV are desirable. $In_xGa_{1-x}As$ compound with x=0.7–0.75 grown on InP substrates have been successfully used for TPV applications. However, the fact that $In_{0.7}Ga_{0.3}As$ layers are lattice mismatched with InP substrates limits the device performance. Recently, $In_{0.16}Ga_{0.84}As_{0.05}Sb_{0.85}$ layers lattice matched to GaSb substrates have been used for TPV cells and the results are comparable to the best achieved for InGaAs/InP devices. Both of these types of TPV cells display internal quantum efficiencies higher than $^{80}\%$ for radiation from 1 micron to 2.1 micron. Thus, their potential for improvement of the internal quantum efficiency from these materials is rather small. However, the open circuit voltage for TPV cells designed for 1000° C. black body radiation is only about 55% of $E_g$ for the 0.55 eV material band gap so that improvement in the open circuit voltage for TPV cells is desirable.

SUMMARY OF THE INVENTION

A thermophotovoltaic cell includes a body having a region of p-type conductivity semiconductor material adjacent a region of n-type conductivity semiconductor material forming a p-n junction therebetween. One of the regions is of a material having a narrow band gap which is capable of absorbing black body radiation. The other region being of a material having a wider band gap than that of the material of the one region so as to form a heterojunction therebetween. The doping level in the region having the wider band gap is an order of magnitude lower than that of the region with the narrower band gap so that a space charge region is in the region having the wider band gap.

BRIEF DESCRIPTION OF THE DRAWING

FIG. 5 is a band diagram of the structure of second form of the cell of the present invention;

FIG. 6 is a band diagram of the structure of a third form of the cell of the present invention; and FIG. 7 is a band diagram of the structure of a fourth form of the cell of the present invention.

DETAILED DESCRIPTION

Figure 1:
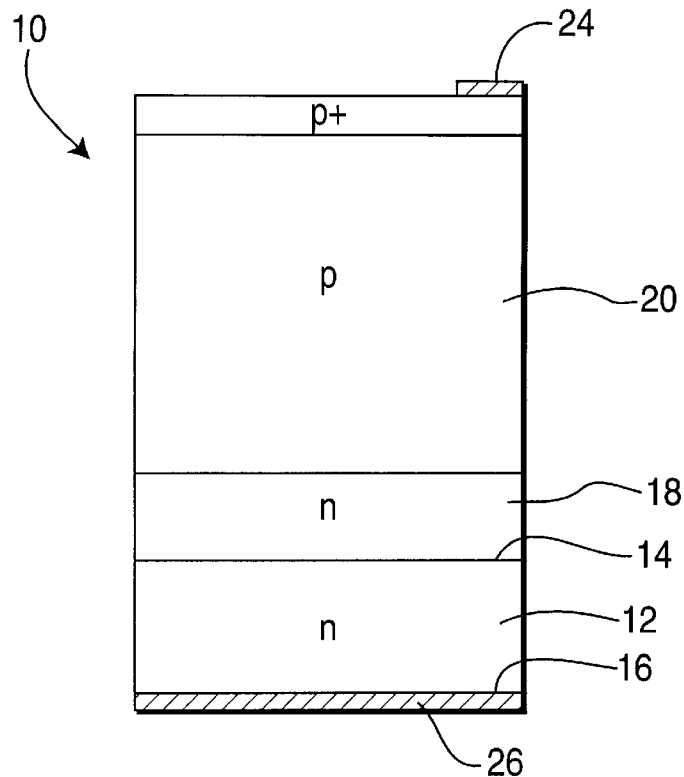
FIG. 1 is a sectional view of a thermophotovoltaic cell of the present invention.

Referring initially to FIG. 1, a thermophotovoltaic (TPV) cell of the present invention is generally designated as 10. TPV cell 10 comprises a substrate 12 of an n-type semiconductor material having opposed top and bottom surfaces 14 and 16. On the top surface 14 is a region 18 of an n-type semiconductor material. On the n-type region 18 is a region 20 of a p-type semiconductor material. On the p-type region 20 is a thin window layer 22 of a $p^+$ type semiconductor material. On the window layer 22 is a contact layer 24 of a suitable conductive material, such as a metal or a combination of metals. The contact layer 24 is only on a portion of the window layer 22 so as to leave the major portion of the window layer exposed to receive the radiation. A contact layer 26 of a conductive material is on the bottom surface 16 of the substrate 12.

The p-type region 20 is of a semiconductor material having a narrow band gap which is capable of absorbing black body radiation, preferably a band gap of no greater than about 0.55 eV. The n-type region 18 is of a semiconductor material having a wider band gap than that of the p-type region 20, a band gap of preferably about 0.75 to 1 eV. Also, the doping level in the p-type region 20 should be an order of magnitude greater than the doping level in the n-type region 18. For example, the doping level in the p-type region 20 may be about $10^{18}$ cm$^{-3}$, whereas the doping in the n-type region 18 would be about $10^{17}$ cm$^{-3}$. This structure provides a thermophotovoltaic cell 10 in which the space charge region is in the wider band gap n-type region 18.

It is known that an increase of the band gap in the space charge region of a photovoltaic cell leads to the exponential decrease of the dark current. It could be shown that at a given illumination level an increase of band gap in the space-charge region should lead to the same increase of the open circuit voltage. As stated above, the structure of the thermophotovoltaic cell 10 localizes the space charge region in the wider band gap n-type region 18. This increases the open circuit voltage by the difference in the band gaps of the p-type region 20 and the n-type region 18. The difference in the band gaps between the n-type region 18 and the p-type region 20 creates a barrier for the electrons in the conduction band which can block the flow of the photogenerated electrons generated in the p-type region 20. We have found that there is a critical height for the barrier which will not decrease the photodiode efficiency. This critical height has been found to be about 8 kT, where k is Boltsmann constant and T is the ambient temperature. For cell operating a room temperature of about 300° K., kT is equal to 26 meV Thus, the thermophotovoltaic cell 10 of the present invention will provide an improved open circuit voltage without decreasing the internal efficiency of the cell.

Figure 2:
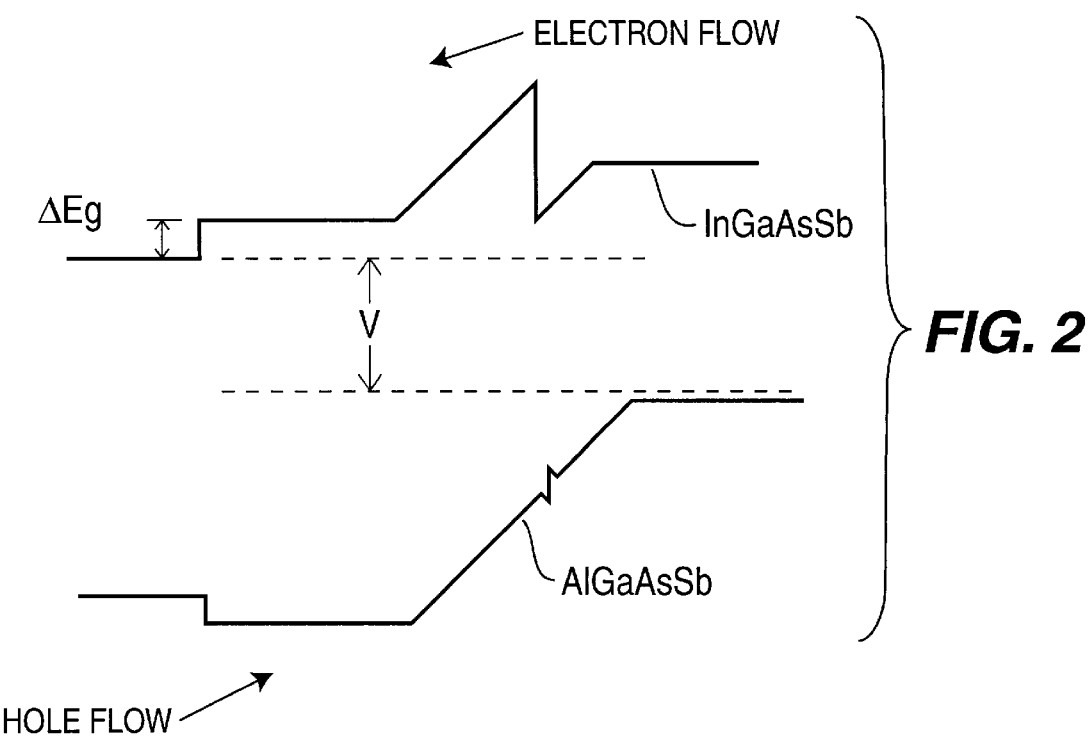
FIG. 2 is a band diagram of the structure of a preferred form of the cell of the present invention.

Referring to FIG. 2 there is shown a band diagram of a preferred form of the thermophotovoltaic cell 10 of the present invention. In this cell, the p-type region 20 is of $In_xGa_{1-x}As_ySb_{1-y}$, and the n-type region 18 is of $Al_xGa_{1-x}As_ySb_{1-y}$. The substrate 12 can be of GaSb. The InGaAsSb can be latticed matched to the GaSb of the substrate 12. To achieve the desired barrier height and doping density, it is preferred that in the $In_xGa_{1-x}AS_ySb_{1-y}$ p-type material that x=0.16 and y=0.15 and the doping density equal about $10^{18}$ cm$^{-3}$. In the n-type $Al_xGa_{1-x}As_ySb_{1-y}$ material it is preferred that x=0.25 and y=0.02 with the doping density being equal to about $10^{17}$ cm$^{-3}$.

Figure 3:
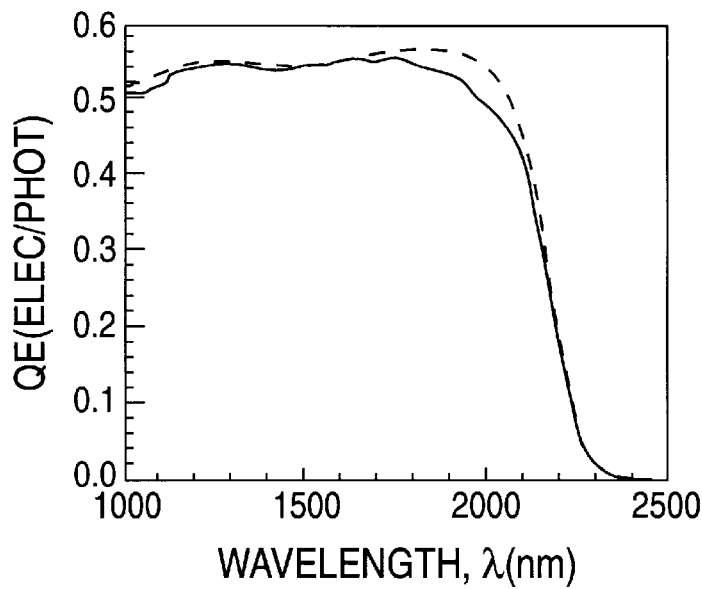
FIG. 3 is a graph comparing the spectral external efficiencies vs wavelength of a TPV cell having a homojunction and a TPV cell in accordance with the present invention having a heterojunction.
Figure 4:
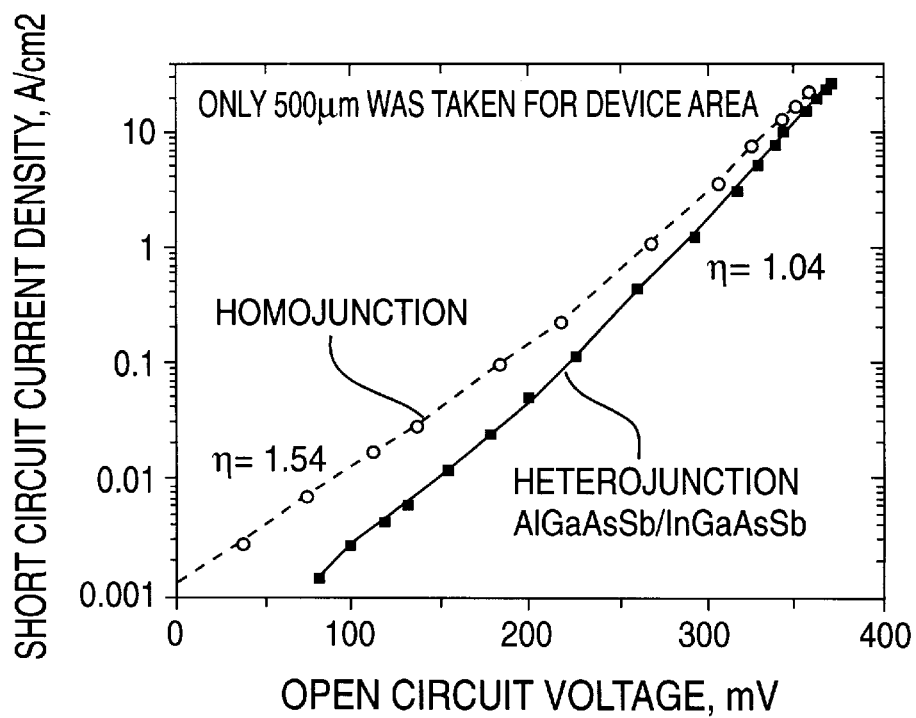
FIG. 4 is a graph comparing the open circuit voltage vs. short circuit current density of a TPV cell having a homojunction and a TPV cell of the present invention having a heterojunction.

A TPV cell having the structure providing the band gap diagram shown in FIG. 2 was made with the p-type region being of a thickness of 3 microns. FIG. 3 shows the external efficiency of the TPV cell of the present invention as compared with that of a TPV cell in which both the p-type region and the n-type region are of $In_{0.16}Ga_{0.84}As_{0.14}Sb_{0.86}$ to have a homojunction. As can be seen from FIG. 3, the cell of the present invention has the same external efficiency as that of the homojunction cell. However, FIG. 4 shows the open circuit voltage characteristics of the two cells. It can be seen from FIG. 4 that the TPV cell of the present invention having a heterojunction has an open circuit voltage which is higher than that of the TPV cell having a homojunction.

Referring to FIG. 5, there is shown the band diagram for a second form of the thermophotovoltaic cell 10 of the present invention. In this form of the cell, the p-type region 20 is of $In_xGa_{1-x}As_ySb_{1-y}$ where x is preferably 0.16 and y is preferably 0.15, and the n-type region 18 is of $Al_xIn_{1-x}As_ySb_{1-y}$ where x is preferably 0.4 and y is preferably 0.56. The doping densities in the two regions are the same as that of the two regions of the cell shown in FIG. 2. However, in this form of the TPV cell, there is no barrier in the conduction band. Thus, all electrons photogenerated in the p-type region will participate in the photocurrent. This should provide a higher increase in the open circuit voltage.

Referring to FIG. 6, there is shown the band diagram for a third form of the thermophotovoltaic cell 10 of the present invention. In this form of the cell, the p-type region 20 is of $In_xGa_{1-x}As$ where x is preferably 0.9, and the n-type region is of $Al_xIn_{1-x}As_ySb_{1-y}$ where x is preferably 0.4 and y is preferably 0.56. This provides a p-type region 20 having a band gap of 0.46 eV and a n-type region 18 having a band gap of 0.78 eV. The doping densities in the two regions are preferably the same as the doping densities in the two regions of the cell shown in FIG. 2. This provides a TPV cell in which the light receiving region is of a band gap lower than 0.55 eV so as to provide a cell with extended IR response.

Referring to FIG. 7, there is shown the band diagram for a fourth form of the thermopohotovoltaic cell of the present invention. In this form of the cell, the region of narrow band gap which receives the radiation is of n-type conductivity and the wider band gap region is of p-type conductivity.

Thus, the region 20 can be of n-type InGaAsSb and the region 18 of p-type GaSb. This structure can either be grown on a p-type GaSb substrate or an insulating layer grown on an n-type GaSb substrate. The p-type InGaAsSb region would be grown first and the n-type AlGaAsSb region would be grown second on the p-type region. Since the conductivity types of the regions are reversed, this provides a heterojunction structure which eliminates the electron diffusion component of the dark current. The total dark current will be reduced to that of its hole component Because of the lower hole mobility this component should be smaller than the electron dark current in the first form. Thus, a greater increase of open circuit voltage should be achieved with this heterojunction structure.

Thus, there is provided by the present invention a thermophotovoltaic cell having two regions of opposite conductivity type forming a p-n junction therebetween. The region which is exposed to the radiation is of a material having a narrow band gap which will absorb the radiation, preferably no greater than about 0.55 eV for black body radiation at a temperature of about 1000° C. The other region is of a material having a wider band gap than that of the region which is exposed to the radiation. This forms a heterojunction between the two regions. The doping density in the radiation receiving region is preferably about an order of magnitude higher than the doping density in the wider band gap material region. This provides a cell having the space charge region in the wider band gap region so that the cell has in increased open circuit voltage but still has a high internal efficiency. In the thermopholovoltaic cell of the present invention, the region having the narrow band gap material for receiving the radiation may be of either n-type conductivity or p-type conductivity. Although the cell of the present invention has been described as a single cell, a plurality of the cells can be arranged in an array or in tandem. Also, although the present invention has been described with regard to a thermophotovoltaic cell, the invention can be used for any type of photodiode since the reverse dark current of a photodiode should be reduced by the same extent compared to that of a homojunction photodiode as the dark direct current of the heterojunction cell. The dark current decrease is useful for photodetectors because noise level decrease with the decrease of dark current level.

What is claimed is:

1. A thermophotovoltaic cell comprising:
    a body of a semiconductor material formed of a region of p-type conductivity semiconductor material adjacent a region of n-type conductivity semiconductor material forming a p-n junction therebetween;
    one of the regions being of a material which will absorb black-body radiation;
    the other region being of a material having a wider band gap than the band gap of the material of the one region so as to form a heterojunction with the one region;
    the doping level in the other region being an order of magnitude less than that in the one region so as to provide a space charge region in the other region.

2. The cell of claim 1 wherein the difference in the band gap of the materials of the two regions is about 8 kT where k is Boltzmann constant and T is ambient temperature.

3. The cell of claim 1 wherein the band gap of the material of the one region is no greater than about 0.55 eV.

4. The cell of claim 3 in which the one region is of p-type conductivity and the other region is of n-type conductivity.

5. The cell of claim 4 wherein the p-type region is of $In_xGa_{1-x}As_ySb_{1-y}$ and the n-type region is of $Al_xGa_{1-x}As_ySb_{1-y}$.

6. The cell of claim 5 where in the material of the p-type region x=0.16 and y=0.15 and in the n-type region x=0.25 and y-0.02.

7. The cell of claim 4 in which the material of the p-type region is $In_xGa_{1-x}As_ySb_{1-y}$ and the material of the n-type region is $Al_xIn_{1-x}As_ySb_{1-y}$.

8. The cell of claim 7 where in the material of the p-type region x=0.16 and y=0.15 and in the material of the n-type region x=0.4 and y=0.56.

9. The cell of claim 4 wherein the material of the p-type region is $In_xGa_{1-x}As$ and the material of the n-type region is $Al_xIn_{1-x}As_ySb_{1-y}$.

10. The cell of claim 9 where in the material of the p-type region x=0.9 and in the material of the n-type region x=0.4 and y-0.56

11. The cell of claim 3 in which the one region is of n-type conductivity and the other region is of p-type conductivity.

12. The cell of claim 11 in which the n-type region is of InGaAsSb and the p-type region is of GaSb.

13. A thermophotovoltaic cell comprising:
- a substrate of a semiconductor material of one type conductivity having first and second opposed surfaces;
- a first region of a semiconductor material of the one type conductivity on the first surface of the substrate, the material of the first region being lattice matched to the material of the substrate;
- a second region of a semiconductor material of a conductivity opposite to that of the first region on the first region, said material of the second region having a band gap which will absorb black-body radiation;
- the material of the first region having a wider band gap than the band gap of the material of the second region so as to form a heterojunction with the second region;
- the doping level in the first region being an order of magnitude lower than the doping level in the second region;
- a conductive contact on a portion of the second region; and
- a conductive contact on the second surface of the substrate.

14. The cell of claim 13 in which the one type conductivity is p-type and the other type conductivity is n-type.

15. The cell of claim 14 in which the difference between the band gap of the p-type region and the band gap of the n-type region is equal to 8 kT where k is Boltzmann constant and T is the ambient temperature.

16. The cell of claim 13 in which the one type conductivity is n-type and the other type conductivity is p-type.

* * * * *